(12) United States Patent
Camarota

(10) Patent No.: US 6,418,045 B2
(45) Date of Patent: Jul. 9, 2002

(54) EFFICIENT AND ROBUST RANDOM ACCESS MEMORY CELL SUITABLE FOR PROGRAMMABLE LOGIC CONFIGURATION CONTROL

(75) Inventor: Rafael C. Camarota, Sunnyvale, CA (US)

(73) Assignee: Adaptive Silicon, Inc., Los Gatos, CA (US)

( * ) Notice: Subject to any disclaimer, the term of this patent is extended or adjusted under 35 U.S.C. 154(b) by 86 days.

(21) Appl. No.: 09/896,406

(22) Filed: Jun. 28, 2001

Related U.S. Application Data

(63) Continuation-in-part of application No. 09/606,791, filed on Jun. 28, 2000, now Pat. No. 6,292,388.

(51) Int. Cl.$^7$ .............................................. G11C 11/00
(52) U.S. Cl. ...................................... 365/156; 365/154
(58) Field of Search ................................. 365/154, 156

(56) References Cited

U.S. PATENT DOCUMENTS 6,292,388 B1 * 9/2001 Camarota .................... 365/156

OTHER PUBLICATIONS

U.S. patent application Ser. No. 09/606,791, Camarota.

* cited by examiner

Primary Examiner—David Nelms
Assistant Examiner—M. Tran
(74) Attorney, Agent, or Firm—Donald R. Boys; Central Coast Patent Agency, Inc.

(57) ABSTRACT

For a programmable Logic Array (PLA) having a nominal operating voltage, a method for ensuring reliable operation of the PLA during a configuration memory read operation comprises steps of (a) providing an intentionally weak pass gate for memory cells in the configuration memory, too weak to flip latches of the memory cells with nodes of the cells powered at the nominal operating voltage; and (b) powering the nodes of the cells with a voltage-controlled source, allowing voltage for the nodes to be reduced during write so latches may be flipped by the weak passgate, and allowing voltage to return to the nominal higher value during read, such that the weak pass gates cannot flip latches. A memory cell with such a weak passgate and operating characteristics is taught, a configuration memory using such cells, and a Programmable Logic Array with such a configuration memory.

4 Claims, 5 Drawing Sheets

Write "1"

Write "0"

Read "1"

Read "0"

EFFICIENT AND ROBUST RANDOM ACCESS MEMORY CELL SUITABLE FOR PROGRAMMABLE LOGIC CONFIGURATION CONTROL

CROSS REFERENCE TO RELATED DOCUMENTS

The present patent application is a continuation-in-part (CIP) from application Ser. No. 09/606,791, filed Jun. 28, 2000, and entitled "Efficient and Robust Random Access Memory Cell Suitable for Programmable Logic Configuration Control".

FIELD OF THE INVENTION

The present invention is in the field of integrated circuits (ICs) and pertains in particular to a new memory cell suitable for use in programmable logic devices for configuration control.

BACKGROUND OF THE INVENTION

Arrangements of transistors in ICs to act as storage locations for binary bits (memory cells) are very well known in the art, and several different arrangements are used for different purposes. It is well known, as well, that memory cells have been integrated in many different ways in many kinds of IC devices. One such device is known as a programmable logic array (PLA), wherein memory cells are used to store bit strings that configure the PLA, that is, that program the PLA to one of the many purposes to which it may be applied. By storing different words in different patterns of memory cells in a PLA, the PLA can be configured to operate in a variety of different ways. Many reference books are available with information on both memory cells and PLAs.

In a PLA the characteristics of the memory cells are quite important. For example, the characteristics of the memory cell structure influence the power requirement and time for power up. Further, in operation of a PLA the state of the memory cells is frequently read for a variety of reasons. The characteristics of the cell structure determine the stability of cells during read operations. If a cell is relatively unstable, it may be flipped to the alternate state during a read operation.

In addition to the above, it is often desirable to alter the pattern of memory words stored in the memory cells in the PLA, to change the configuration of the PLA. In this process it is also desirable to reset the memory structure, that is, to drive all memory cells to a "1" condition, or all to a "0" condition, and then to write new data to the cells. The energy required to flip a single cell is vastly multiplied at reset because there are a very large number of memory cells in a state-of-the-art PLA. Flipping all cells results in a large current requirement. Without special design considerations in the memory system, current designs have a requirement that relatively small groups of cells may be written simultaneously.

What is clearly needed is a new and robust memory cell design that is stable for read operations, and at the same time requires a relatively low energy to flip the cell during a write operation. Just such a cell structure and operation is described in enabling detail below.

SUMMARY OF THE INVENTION

In a preferred embodiment of the present invention a Programmable Logic Array (PLA) having an operating voltage of Vcc, and a configuration memory is provided, comprising a plurality of memory cells each having first and second inverters connected input to output to make a latch defining a Q node and a QB node, and powered by a single voltage-controlled Vmm line, a passgate transistor for each of the plurality of cells, the passgate transistor connected source-to-drain from a BIT line to the first inverter output, the passgate having a strength sufficiently low that, with Vmm substantially equal to Vcc and the gate of the passgate energized at Vcc by a WORD signal, no signal on the BIT line can flip the latch, and circuitry for reducing the voltage of Vmm during write operations so a signal on the BIT line may flip the latch through the passgate. The weak passgates reduce effect on the Q and QB nodes of the memory cells during read operations sufficiently that the PLA can be operated during configuration memory read operations.

In another aspect a Programmable Logic Array (PLA) having a nominal operating voltage is provided, comprising a configuration memory writable in specific control patterns, and an array of configurable programmable logic devices selectable by the configuration memory to perform specific tasks according to individual ones of the specific control patterns. The PLA is characterized in that the configuration memory comprises cells each having Q and QB nodes and an intentionally weak passgate, and a controlled-voltage node connected for powering the Q and QB nodes, such that the voltage on the nodes may be lowered substantially below the nominal operating voltage during writes to facilitate flipping latches by the weak passgate, and also characterized in that, with the voltage on the nodes raised to substantially the nominal operating voltage during read operations, the Q and QB nodes are unaffected by the weak passgate, allowing the PLA to operate during read operations.

In still another aspect of the invention, for a programmable Logic Array (PLA) having a nominal operating voltage, a method for ensuring reliable operation of the PLA during a configuration memory read operation is provided, comprising the step of (a) providing an intentionally weak pass gate for memory cells in the configuration memory, too weak to flip latches of the memory cells with nodes of the cells powered at the nominal operating voltage; and (b) powering the nodes of the cells with a voltage-controlled source, allowing voltage for the nodes to be reduced during write so latches may be flipped by the weak pass gate, and allowing voltage to return to the nominal higher value during read, such that the weak pass gates cannot flip latches.

In yet another aspect of the invention a Programmable Logic Array (PLA) is provided comprising a configuration memory having a plurality of memory cells each having first and second inverters connected input to output to make a latch defining a Q node and a QB node, and a passgate transistor for individual ones of the plurality of cells, the passgate transistor connected source-to-drain from a BIT line to the first inverter output, the passgate having a strength sufficiently low during READ operations that the execution of the READ operation has no substantial effect on the PLA function controlled by the Q and QB nodes of the memory cells.

With the advent of the inventions taught herein in enabling detail below, for the first time a PLA is provided to the art in which PLA functions and operations may reliably continue during the same time that memory reads are made on the configuration memory, to accomplish such as memory content verification.

BRIEF DESCRIPTION OF THE DRAWING FIGURES

DESCRIPTION OF THE PREFERRED EMBODIMENTS

Figure 1:
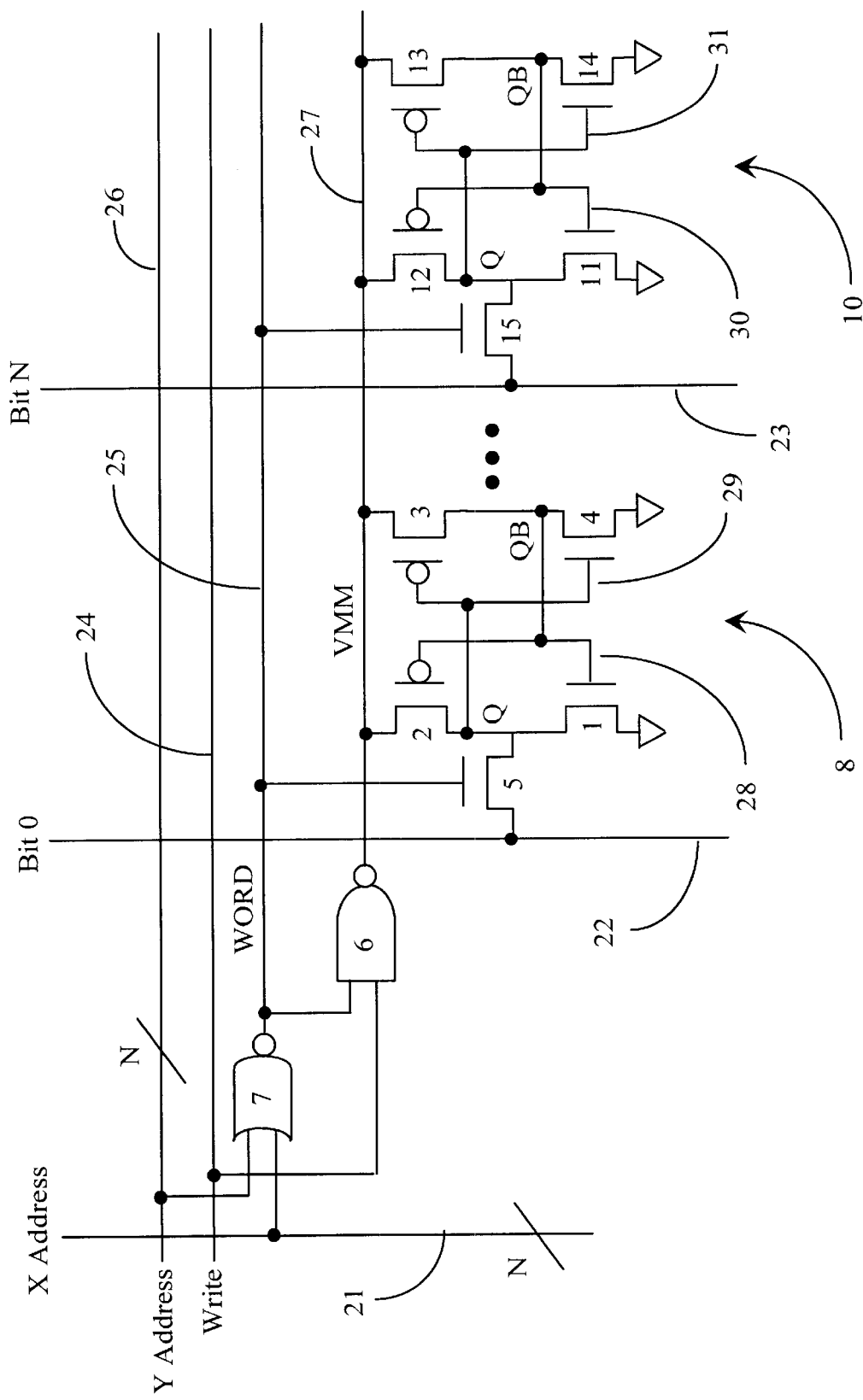
FIG. 1 is a schematic representation of two memory cells and connections to other structures in a PLA according to an embodiment of the present invention.

FIG. 1 is a schematic diagram showing two memory cells 8 and 10 according to a preferred embodiment of the present invention, together with connections, interconnections, and peripheral structure. Each cell stores one bit, and two bit lines are shown, one labeled Bit 0, and the other Bit N. This labeling is because the two cells shown are meant to represent an arbitrary number of such cells, creating matrices capable of storing a plurality of bit strings (binary words) as is common in most memory devices.

Each memory cell has 4 transistors arranged to make up a latch, and a fifth transistor acting as a passgate. In cell 8 the four transistors are transistors 1, 2, 3 and 4; in cell 10 they are 11, 12, 13 and 14. Referring now only to cell 8, transistors 1 and 2, in which transistor 1 is a NMOS device and transistor 2 is a PMOS device, define a first inverter, and transistors 3 (PMOS) and 4 (NMOS) define a second inverter. The inverters are hooked up input to output to make a latch. The latch input to output nodes are designated as Q and QB respectively, and the interconnecting lines themselves are labeled 29 and 28 respectively. In cell 10 there is analogous structure, as shown.

The inverter PMOS device sources (2 and 3 in cell 8, 12 and 13 in cell 10) are not connected to supply voltage Vcc (not shown) at all times, as is typical of conventional memory cells, but by a special source Vmm, which is output of a NAND gate 6. Vmm is used in the writing process. The bulk or N-Well taps of the inverter PMOS devices go to the system Vcc node and not to Vmm.

The fifth transistor of each cell is a passgate for that cell (element 5 for cell 8, and element 15 for cell 10). Each passgate is connected between the Q node of the associated cell and a common BIT node. The BIT nodes are labeled 22 and 23 respectively for cells 8 and 10. The gates of passgate devices 5 and 15 are connected to a common WORD line, also labeled as line 27. The memory in the instant example is organized into words of N bits. The number of bits in a word is not germane to the operation of the system or to the invention.

In preferred embodiments of the present invention WORD node 25 is output of a NOR gate 7, whose inputs are X address and Y address.

In a preferred embodiment, enabled for PLAs, there are 32 bits to a word, requiring therefore 32 memory cells like the two shown in FIG. 1 for each word. The 32 memory cells in the same word share the same WORD and Vmm signals, labeled 25 and 27 respectively. There are 32 BIT signals (BIT 0 to BIT 31) that are common for the respective bits of each word in the memory system, and these 32 bit signals are represented by BIT 0 and BIT N.

The sizing of the latch inverters and the Q to BIT passgate is based on two constraints. The passgate is sized such that when Vmm and WORD are at a voltage substantially equal to Vcc, any voltage on the BIT node will not flip the value in the memory cell latch. This is true for both stable states of the latch, Q at Vcc or Q at GND. This provides stability against accidental flipping of the gates during read operations.

Secondly, during a read the Q and QB node voltages are altered from their normal Vcc or GND levels, but not enough to flip the cell or to cause incorrect operation of the programmable logic, which the memory cell might control. If these two constraints are met, then the cell cannot be written through the Q to BIT passgate when Vmm is at Vcc. To write to the cell the Vmm node voltage must be reduced to make the inverter latch weaker so that the BIT to Q passgate can flip the state of the latch.

Reducing the Vmm voltage, which is accomplished by the novel arrangement of gates 6 and 7 and their input and output interconnections, has two functions. Firstly, this allows the intentionally weak passgate to flip the latch. Secondly, this substantially reduces the transient current needed to flip a cell. For example, when the Vmm is at a voltage below the threshold of the NMOS and PMOS devices making up the latch the cell flips very easily. A flipped cell will power up as Vmm is raised to normal Vcc since the high node Q or QB will follow to Vcc as the Vmm signal rises to Vcc.

In typical memory applications only one word is written at a time because of the substantial energy requirements to write to the conventional cell structures. The transient current is thus limited, because only a limited number of cells (the number of cells in a word) are flipped at any one time, and only one cell per BIT line is flipped at any point in time. Memory arrays used as configuration control for programmable logic, however, have a need to be globally reset during a power-up cycle, and there is a need to reset relatively large blocks of the configuration control memory as part of a dynamic reconfiguration strategy.

In a conventional memory cell too many cells written on one BIT line would overwhelm the strength of a BIT line driver. Further, too many cells flipping at the same time will require more current then the Vcc and GND nodes could supply, either because of IR drop, current density, or overall chip ICC limits. Keeping in mind that a programmable logic device might need to have more then 100,000 memory latches reset at the same time. Even at a few uA for each latch, hundreds if not thousands of milliamps might be required during reset.

FIGS. 2a through 2d are timing diagrams of write and read operations for the system of FIG. 1 according to a preferred embodiment of the present invention.

Figure 2A:
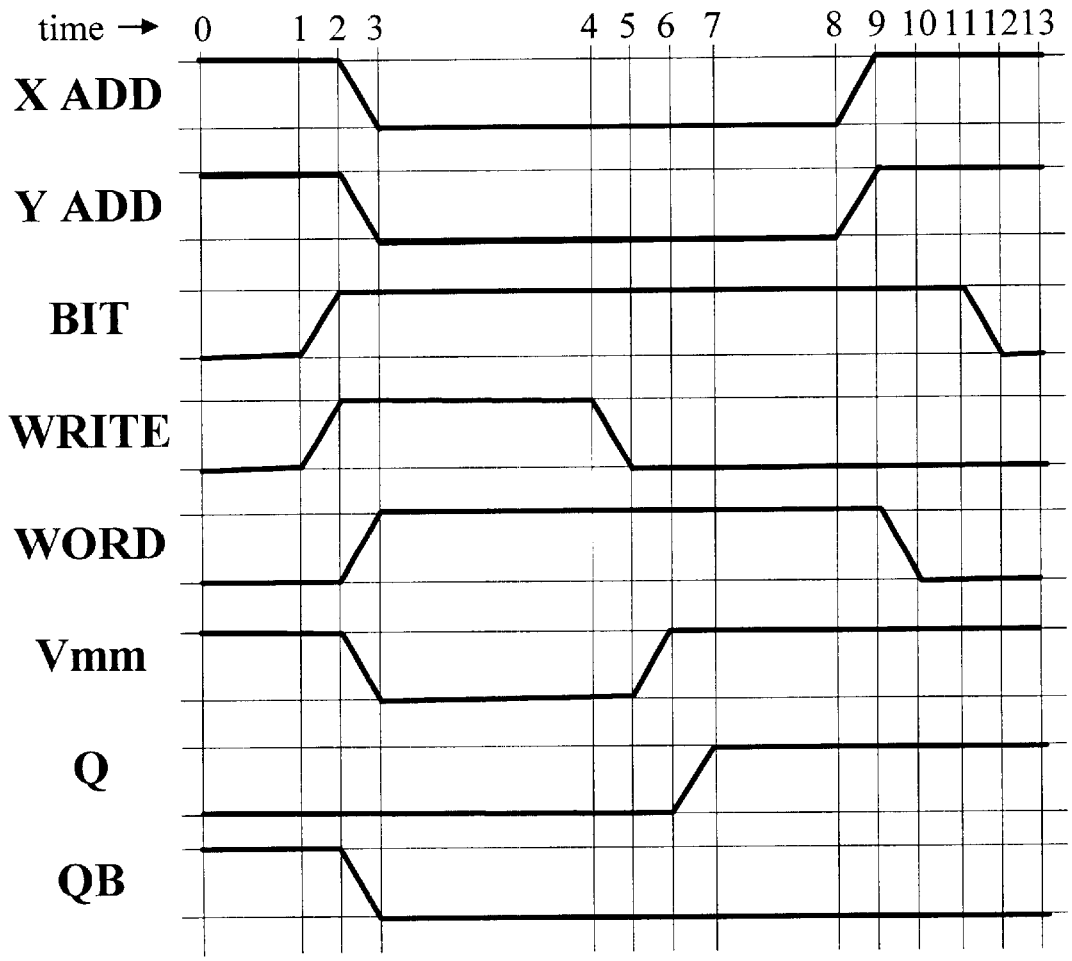
FIG. 2a is a timing diagram for a Write "1" operation in an embodiment of the present invention.

Referring first to FIG. 2a, which shows the signal timing for a write of "1" to a cell of FIG. 1:

(a) at time 1 both the BIT and the Write signals are asserted. Referring to FIG. 1, and considering just cell 8, BIT 0 asserts Vcc at the input of passgate 5, and the WRITE signal is an input to NAND gate 6. Because of the fact that WORD has not been asserted, the output of 6 (Vmm) is essentially Vcc, and Vcc on the BIT line cannot flip the latch.

(b) at time 2 both X and Y address signals are asserted (active low), and, as both are inputs to NOR gate 7, WORD becomes, as a result, active high at time 3.

(c) As WORD is an input to NAND gate 6, and the other input to NAND gate 6, WRITE, went high at time 2, Vmm, the output of NAND gate 6, goes low at time 3.

(d) because Vmm is below the threshold of the NMOS and the PMOS devices making up the latch, QB goes low at time 3, and now the input on the BIT line can flip the latch.

(e) at time 4 the Write signal is asserted low, so Vmm goes to Vcc by time 6. Because Vmm goes to Vcc, Q goes to Vcc, and the write is accomplished. Now, because, again, of the intentionally weak passgate, any change in the signal on the BIT line cannot flip the latch.

In this novel approach the Write is accomplished essentially by making the proper signals, then lowering the voltage on Vmm to allow the latch to flip.

Figure 2B:
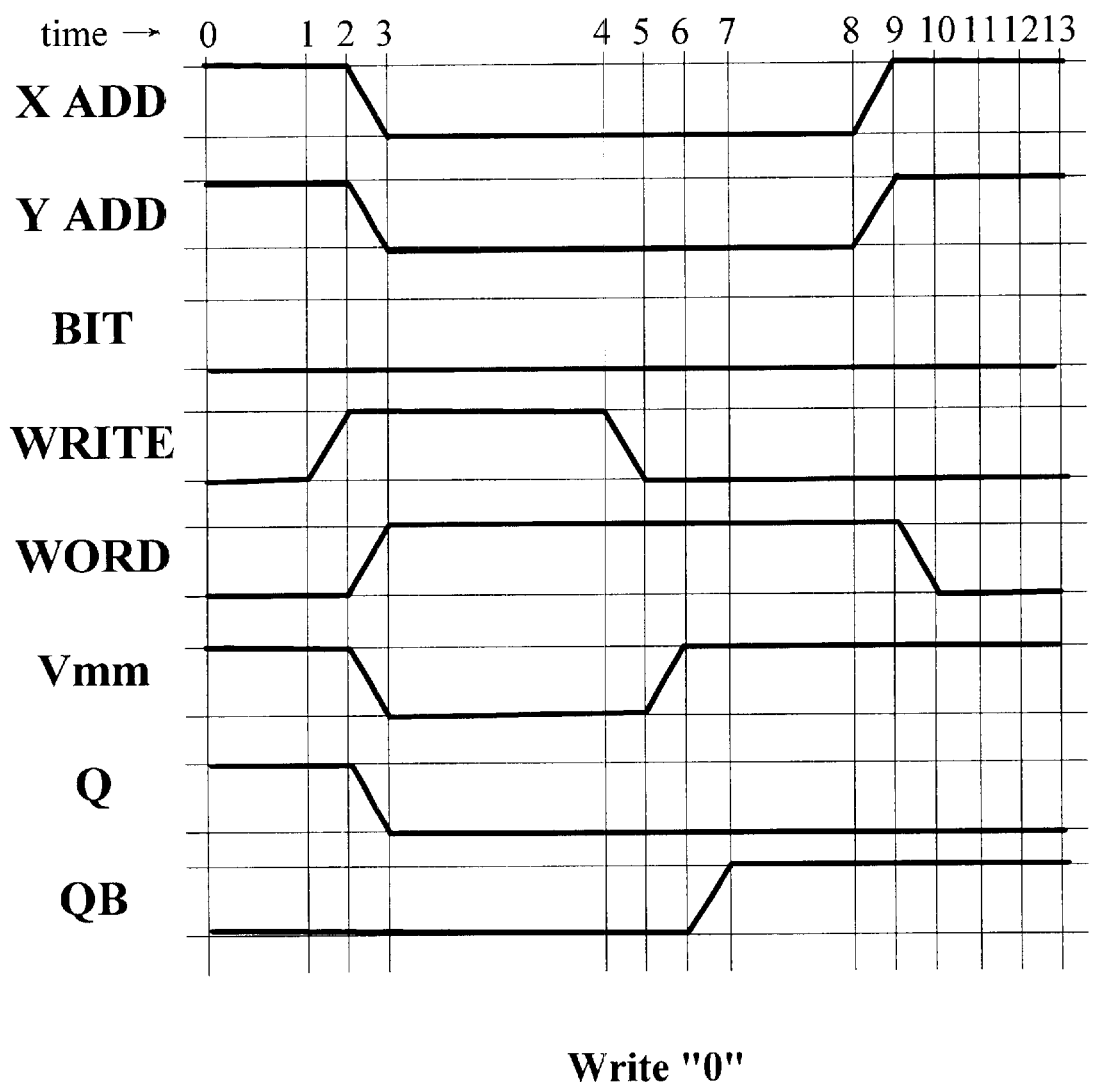
FIG. 2b is a timing diagram for a Write "0" operation in an embodiment of the present invention.

Referring now to FIG. 2b, which shows the signal timing for a write of "0" to a cell of FIG. 1:

(a) All signals asserted save the BIT signal are asserted at the same times and in the same way as for the "1" write described just above. In this case the BIT signal stays low.

(b) While Vmm is at Vcc with an intentionally weak passgate, no signal on BIT can flip the latch. When Vmm falls beginning at time 2, as in the write "1" case, the Q value goes to 0.

(c) when the write signal ends beginning at time 4, Vmm starts up, and then QB charges up to Vcc.

(d) Now, since Vmm is charged up to Vcc again, no change on BIT will flip the latch.

Figure 2C:
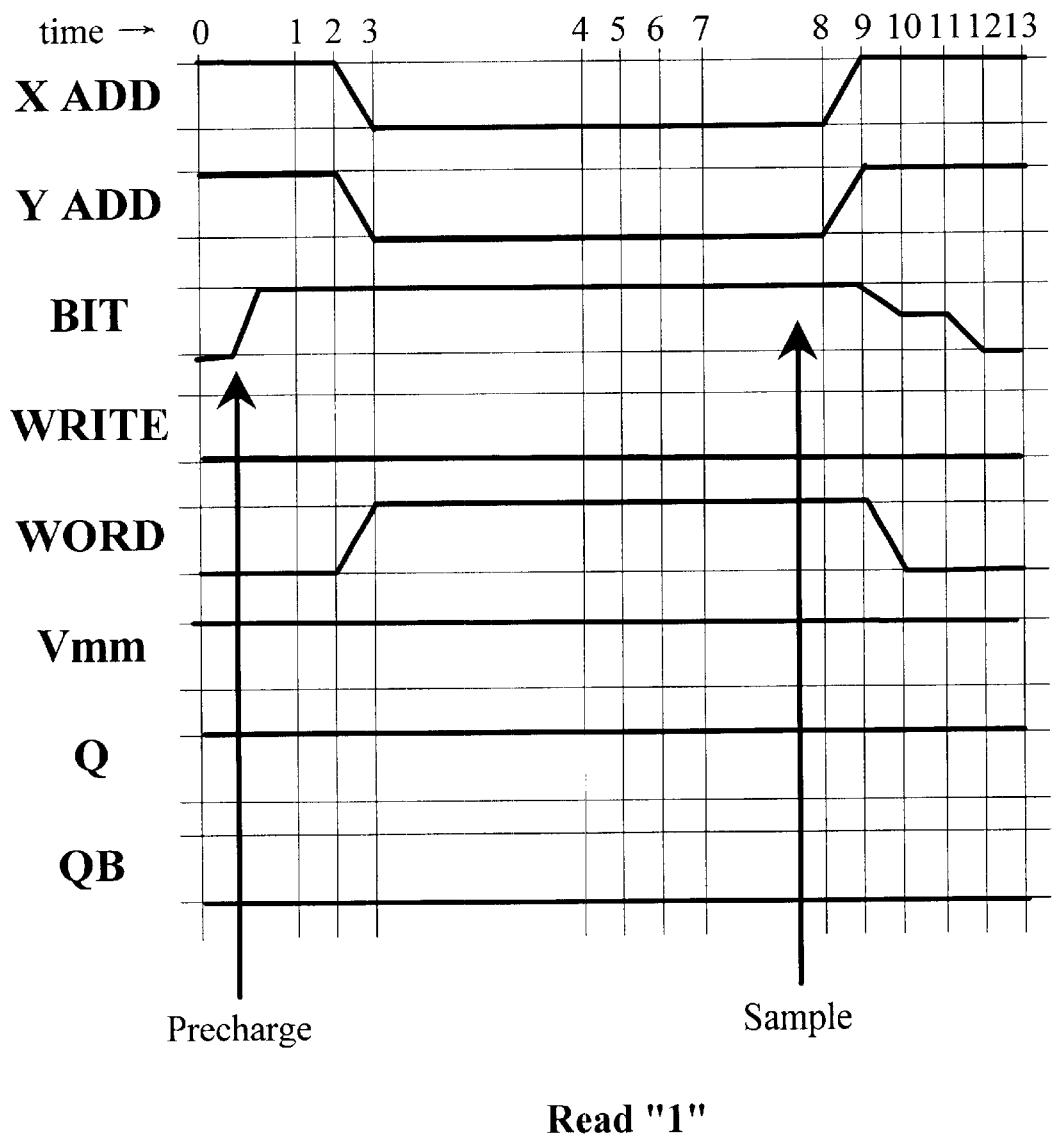
FIG. 2c is a timing diagram for a Read "1" operation in an embodiment of the present invention.

Referring now to FIG. 2c, which illustrates a read "1":

(a) Bit is asserted prior to time 2, as shown, to precharge the bit line.

(b) X address and Y address are asserted at the same times and in the same way as before.

(c) WRITE is never asserted, so Vmm stays high (Vcc).

(d) when WORD is asserted, by virtue of the Address signals, the intentionally weak passgate allows Q (high) to reinforce the precharge "1" on BIT.

(e) sample is taken in this case at just before time 8, and before WORD goes low by virtue of X and Y address signals being driven high at time 9, which causes WORD to go low, turning off passgate 5. With the passgate turned off after time 9 the voltage on BIT begins to decay (not further reinforced by Q).

Figure 2D:
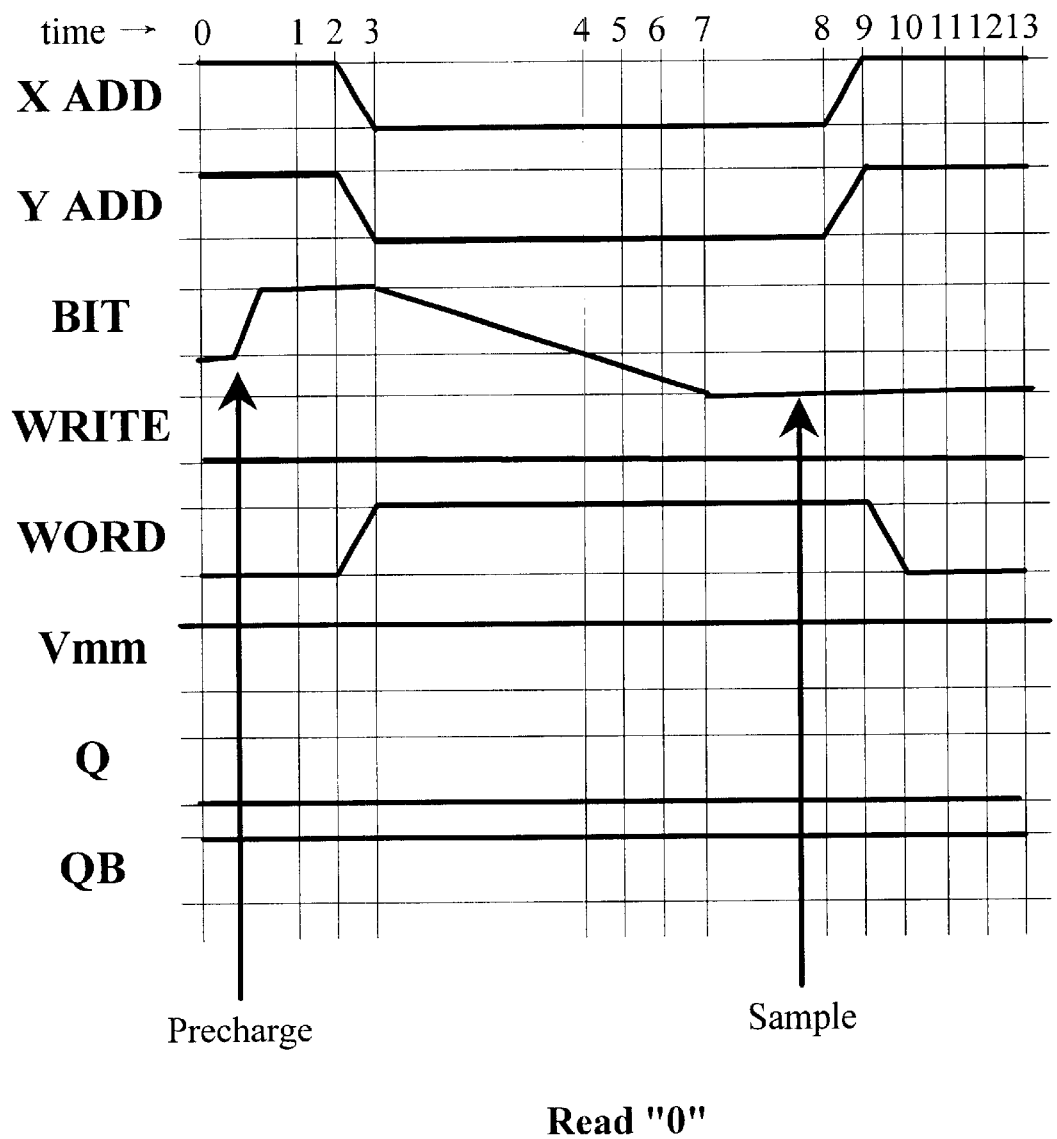
FIG. 2d is a timing diagram for a Write "0" operation in an embodiment of the present invention.

Referring finally to FIG. 2d, which shows the case for reading a 0:

(a) Bit is precharged prior to time 2 as for read "1" described above.

(b) X address and Y address are asserted as before.

(c) When WORD goes high at time 3, as a result of inputs X and Y address to NOR gate 7, intentionally weak passgate 5 is turned on.

(d) because the passgate is weak, the "1" on BIT cannot flip the latch. Therefore the BIT signal begins to fall.

(e) At time 7 BIT is at 0, and is again sampled before time 8, as shown, reading a "0".

With the Vmm in the embodiment of the invention described above with reference to FIG. 1 at a depressed level the DC crossover current during reset can be reduced to nanoamps (nA). In one embodiment the DC crossover current limit is managed to be <10 nA per bit, worst case, during a reset. There is also a transient current caused by the transition of the Vmm node from Low to High, but this is proportional to the capacitance of the Vmm node, and by the rise time of the Vmm node.

To reset a single word, writing all zeros, the BIT is at 0 volts, the appropriate X and Y address are at 0 volts making the WORD line Vcc. Then the WRITE signal is pulsed momentarily to Vcc. This in turn pulses Vmm low, allowing the intentionally weak pass gate to flip the latch as the Vmm is rising back to Vcc. The organization of the X and Y Address is such that if multiple X's and Y's were enabled simultaneously then multiple words could be reset at the same time at a very low power level.

The memory cell is initialized to zero at power up by applying WRITE and all Address lines when Power On Reset (POR) is present (POR not shown in the diagrams). The BIT lines are all zero at this time as well. When the WRITE is removed first after POR is removed, followed some short time, say 10–20 ns, by the address lines. In preferred embodiments the address signals are removed in phases separated by a few ns to reduce transient power required to switch all the WORD line capacitance.

In a further aspect of the present invention, memory cells according to preferred embodiments taught herein have much higher tolerance to process variations than do structures known in the current art. In embodiments of the present invention, since the strength of the passgate is not crucial to writing efficiency, the passgate strength can be made weaker due to eased writing requirements, providing additional margin during read. This wide operating range is useful in allowing additional process variation than has before been possible, and allows for rapid process migration.

It will be apparent to the skilled artisan that there are many alterations that may be made in the embodiments of the invention described herein without departing from the spirit and scope of the invention. For example, it is central to the invention that a memory cell have a relatively weak passgate, so the latch will be very stable, such that capacitance (for example) on a bit line cannot cause a latch to flip unintentionally. To achieve this condition without further innovation it would be difficult to write to a cell, and a lot of energy would be required. The further innovation in the present case is to add logic circuitry that alters the power side of the cells, to which the PMOS transistors are connected, so the voltage at that point, which is typically the full operating voltage of the circuitry (Vcc), is driven to a low value, making the cell easy to write with a minimum of energy.

Configuration Memory Verification During Operation

The present invention, in embodiments taught in enabling fashion above, provides a memory cell and operating connections to the cell, in a manner that inverter CMOS device sources are not driven by the standard operating voltage, termed Vcc in this specification, as is typical in the art, but by a special voltage node termed Vmm herein. Vmm is intentionally lowered in write mode to make the inverter latch weaker than in the current art, allowing a weak passgate to flip the latch, which also significantly lower the transient current needed to flip a cell, and enables resetting of larger numbers of cells at the same time in architectures using large numbers of memory cells. This is a distinct advantage in configuration memory architecture for PLAs.

In considering the application of the novel memory cell structure and operation in application to configuration memory for PLAs, the relatively weak bit line pass gate has an additional advantage during read operations. Since in a PLA the Bit line is typically a relatively long line with a high fanout, and therefore also a high capacitance, during read operations great care needs be exercised in prior art devices to prevent charge and voltage on the bit line from flipping latches.

With the weaker pass gate transistor allowed by the unique design taught herein, it is possible not only to prevent flipping of cells, but also to further reduce voltage swing on the Q and QB nodes so that read operations cannot effect the function or performance of an operating PLA directed by the configuration memory comprising the new memory cells and configurable operating circuitry.

Accordingly, with a configuration memory comprising cells of the new type taught herein, driven by a weaker than conventional passgate, wherein the inverter sources are driven by a reduced voltage during write, it is no longer necessary to suspend operation of a PLA to check and verify memory content. This checking and verification is an operation that is often desirable to guard against many kinds of anomalies, such as alpha-particle interaction with CMOS latches and electromagnetic effects that may occur over time in use of PLAs.

There are many variations possible to the embodiments described above within the spirit and scope of the invention. For example the circuitry involving gates 6 and 7 may be implemented in a number of different ways. Further, there are a wide variety of architectures for PLAs, and a similarly wide variety of applications to which such devices may be applied. Accordingly the invention should be accorded the breadth of the claims that follow.

What is claimed is:

1. A Programmable Logic Array (PLA) having an operating voltage of Vcc, and a configuration memory comprising:
    a plurality of memory cells each having first and second inverters connected input to output to make a latch defining a Q node and a QB node, and powered by a single voltage-controlled Vmm line;
    a passgate transistor for each of the plurality of cells, the passgate transistor connected source-to-drain from a BIT line to the first inverter output, the passgate having a strength sufficiently low that, with Vmm substantially equal to Vcc and the gate of the passgate energized at Vcc by a WORD signal, no signal on the BIT line can flip the latch; and
    circuitry for reducing the voltage of Vmm during write operations so a signal on the BIT line may flip the latch through the passgate;
    wherein the weak passgates reduce effect on the Q and QB nodes of the memory cells during read operations sufficiently that the PLA can be operated during configuration memory read operations.

2. A Programmable Logic Array (PLA) having a nominal operating voltage, comprising:
    a configuration memory writable in specific control patterns; and
    an array of configurable programmable logic devices selectable by the configuration memory to perform specific tasks according to individual ones of the specific control patterns;
    characterized in that the configuration memory comprises cells each having Q and QB nodes and an intentionally weak passgate, and a controlled-voltage node connected for powering the Q and QB nodes, such that the voltage on the nodes may be lowered substantially below the nominal operating voltage during writes to facilitate flipping latches by the weak passgate, and also characterized in that, with the voltage on the nodes raised to substantially the nominal operating voltage during read operations, the Q and QB nodes are unaffected by the weak passgate, allowing the PLA to operate during read operations.

3. For a programmable Logic Array (PLA) having a nominal operating voltage, a method for ensuring reliable operation of the PLA during a configuration memory read operation, comprising the step of:
    (a) providing an intentionally weak pass gate for memory cells in the configuration memory, too weak to flip latches of the memory cells with nodes of the cells powered at the nominal operating voltage; and
    (b) powering the nodes of the cells with a voltage-controlled source, allowing voltage for the nodes to be reduced during write so latches may be flipped by the weak pass gate, and allowing voltage to return to the nominal higher value during read, such that the weak pass gates cannot flip latches.

4. A Programmable Logic Array (PLA) comprising:
    a configuration memory having a plurality of memory cells each having first and second inverters connected input to output to make a latch defining a Q node and a QB node; and
    a passgate transistor for individual ones of the plurality of cells, the passgate transistor connected source-to-drain from a BIT line to the first inverter output, the passgate having a strength sufficiently low during READ operations that the execution of the READ operation has no substantial effect on the PLA function controlled by the Q and QB nodes of the memory cells.

* * * * *